(12) United States Patent
Kim et al.

(10) Patent No.: US 7,062,004 B1
(45) Date of Patent: Jun. 13, 2006

(54) METHOD AND APPARATUS FOR ADAPTIVE CONTROL OF PLL LOOP BANDWIDTH

(75) Inventors: Gyudong Kim, San Jose, CA (US); Min-Kyu Kim, Cupertino, CA (US); Ook Kim, Palo Alto, CA (US); Eric A. Lee, San Jose, CA (US); Bruce Kim, Los Altos, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 797 days.

(21) Appl. No.: 09/905,511

(22) Filed: Jul. 13, 2001

Related U.S. Application Data (60) Provisional application No. 60/296,655, filed on Jun. 6, 2001.

(51) Int. Cl.
*H04L 7/00* (2006.01)

(52) U.S. Cl. ........................... 375/371; 375/376

(58) Field of Classification Search ................ 375/316, 375/371, 376; 327/156–157; 331/1 A, 17; 455/232.1; 702/69
See application file for complete search history.

(56) References Cited

U.S. PATENT DOCUMENTS

| | | | | |
|---|---|---|---|---|
| 4,691,176 A * | 9/1987 | Hsiung et al. | ............... | 331/2 |
| 4,789,996 A * | 12/1988 | Butcher | ............... | 375/376 |
| 5,056,118 A * | 10/1991 | Sun | ............... | 375/342 |
| 5,208,546 A * | 5/1993 | Nagaraj et al. | ............... | 327/157 |
| 5,268,655 A * | 12/1993 | Dong | ............... | 331/16 |
| 5,604,773 A * | 2/1997 | Urala | ............... | 375/372 |
| 5,757,652 A * | 5/1998 | Blazo et al. | ............... | 702/69 |
| 5,828,255 A * | 10/1998 | Kelkar et al. | ............... | 327/157 |
| 6,044,122 A * | 3/2000 | Ellersick et al. | ............... | 375/360 |
| 6,151,076 A * | 11/2000 | Hoffman et al. | ............... | 348/512 |
| 6,307,411 B1 * | 10/2001 | Kerner | ............... | 327/156 |
| 6,614,275 B1 * | 9/2003 | Amick et al. | ............... | 327/158 |
| 6,696,886 B1 * | 2/2004 | Ke et al. | ............... | 327/553 |
| 2002/0064247 A1 * | 5/2002 | Ahn et al. | ............... | 375/354 |
| 2004/0001567 A1 * | 1/2004 | Wei | ............... | 375/371 |

* cited by examiner

*Primary Examiner*—Emmanuel Bayard
*Assistant Examiner*—Lawrence B. Williams
(74) *Attorney, Agent, or Firm*—Perkins Coie LLP (57) ABSTRACT

A scheme for reducing jitter in high-speed digital communication by adaptively controlling the loop bandwidth of a receiver PLL to reduce the relative jitter between the recovered data and clock. The scheme uses phase pointer activity to represent the relative jitter. The phase pointer activity is measured and used to control the receiver PLL loop bandwidth. The receiver PLL loop bandwidth is repeatedly incremented or decremented by a step size based on the comparison between a newly measured activity value and the old activity value, until the phase pointer activity reaches a minimum. Because the PLL performance requirement of the transmitter can be relaxed, compatibility with legacy transmitters and multi-vendor transmitters is enhanced. Because tight control of fabrication process parameters of PLLs may be relaxed, the fabrication yield may also be improved.

45 Claims, 7 Drawing Sheets

METHOD AND APPARATUS FOR ADAPTIVE CONTROL OF PLL LOOP BANDWIDTH

RELATED APPLICATION

This application claims the benefit of U.S. Provisional Application No. 60/296,655, filed on Jun. 6, 2001, now abandoned, entitled "Method and Apparatus for Adaptive Control of PLL Loop Bandwidth."

BACKGROUND OF THE INVENTION

1. Technical Field

The present invention relates to data communications. More particularly, this invention relates to adaptive control of a PLL loop bandwidth to reduce jitter in high-speed digital data transmission.

2. Description of the Related Art

High-speed digital connections are increasingly used to enable communications between various devices, such as a host and a display. For example, the Digital Visual Interface (DVI), one of the industry standards for video transmission, aims to provide a robust digital link using Transition-Minimized Differential Signaling (TMDS) in an environment where severe jitter is present between a transmitter and a receiver. The transmitter typically uses a phase-locked loop (PLL) to extract data in a bit stream, while the receiver uses a PLL to receive data from the received bit stream. For more details on TMDS, refer to DVI Specification Revision 1.0, Apr. 2, 1999 from Digital Display Working Group (DDWG).

A PLL consists of a phase detector, a loop filter, and a voltage-controlled oscillator (VCO) connected in a feedback loop. The phase detector compares the phase of the input signal with the output signal from the VCO and adjusts the VCO until the phase difference is very small, at which point the VCO phase is locked to the input phase.

Jitter may be present in the system where PLLs are used in the transmitter and the receiver. In order to reduce jitter in such an environment, it is important to use those PLLs whose parameters are compliant to a given specification. An important parameter is a PLL loop bandwidth, which is the cutoff frequency in the frequency response of a PLL loop operation, indicating how fast the PLL loop response is. The transmitter PLL loop bandwidth and the receiver PLL loop bandwidth affect the relative jitter between the transmitter PLL and the receiver PLL.

In a high-speed digital transmission system such as a TMDS system, the transmitter and the receiver share the same clock. However, the instantaneous clock phases at the transmitter and at the receiver may be different. The difference is termed relative jitter, which may cause a bit error if excessive. In general, if the transient response of the transmitter PLL and that of the receiver PLL with respect to the incoming jitter is similar, the relative jitter between the transmitter PLL and the receiver PLL is minimized.

Unfortunately, not every PLL used in such an environment is compliant to specification, resulting in a problematic system solution. For example, although many current product transmitter PLLs are claimed to be DVI/TMDS compliant, some of them are not fully compliant to that specification. To make a PLL whose loop bandwidth complies with a particular specification is not an easy task because it involves not only robust circuit design but also tight control over fabrication process parameters. As a result, there are many cases where the loop bandwidth of the transmitter PLL and that of the receiver PLL do not match, which increases the jitter in the system.

The problem is further compounded by the use of different transmitter architectures. For example, there are two principal schemes for generating a clock sent from the transmitter to the receiver in a digital link using TMDS or the like. One is a coherent clocking scheme where both the clock and the data are generated through a PLL. The other is an incoherent clocking scheme where the data is generated through a PLL but the clock is not. Although the incoherent transmitter architecture may be favored in the DVI specification, coherent transmitter architectures are still available in the market and a novel coherent architecture may emerge. Since the DVI specification is not specific about the coherency, it is important to design a receiver that can support both schemes. Also, it is important for such a feature to support other standards.

For the coherent clocking scheme, the clock recovery circuit in the receiver is required to have as fast a response as possible, such as that provided by a delay locked loop (DLL). If a PLL is used, the loop bandwidth of the PLL should be maximized to make the response as fast as possible. Although reducing absolute jitter may lead to reducing relative jitter, it is not always easy nor guaranteed. Therefore, reducing the relative jitter with a somewhat large absolute jitter level becomes important. Conventional communication schemes are geared for reducing the absolute jitter, the coherent scheme being an example.

A transmitter using the coherent clocking scheme often uses a narrow bandwidth PLL as a clock generator to generate an output clock. The narrow bandwidth PLL usually filters out the jitter in the input clock at the transmitter. As the data rate increases, however, the channel gets more susceptible to high frequency noise sources such as capacitive/inductive coupling, inter-symbol interference, and reflection. Since these interferences are not under the control of the transmitter PLL and are of a wide band nature, the coherent clocking scheme becomes more susceptible to these interferences.

With the incoherent clocking scheme, the clock recovery circuit in the receiver is required to have similar loop characteristics to the PLL in the transmitter. A DLL cannot be used for the clock generating circuitry in the receiver. Instead, either a configurable PLL or DLL/PLL composite architecture preferred. A loop bandwidth mismatch results from unreliable circuit construction or process/temperature/supply voltage variations. Hence, it is desirable that the receiver can adapt to the variation of the transmitter PLL characteristics.

Therefore, there is a need for a scheme that can reduce jitter in a high-speed digital transmission system by adapting the receiver characteristics to the transmitter characteristics, such as the variation in the transmitter PLL and the transmitter clock generation method.

SUMMARY OF THE INVENTION

It is an object of the present invention to control the jitter in a high-speed digital transmission system while utilizing a PLL that may not be fully compliant to a particular specification.

Another object is to control the jitter regardless of the clock generation methods used in the transmitter.

These and other objects are accomplished by adapting the characteristics of the receiver clock generating circuitry to the characteristics of the transmitter. Specifically, the loop bandwidth of the receiver PLL is adaptively adjusted to reduce the relative jitter between the recovered data and clock.

One preferred embodiment includes a receiver PLL whose loop-bandwidth is adjustable, a phase-tracking unit for determining a phase pointer representing the relative phase between the recovered data and clock, and control logic for measuring the activity of the phase pointer to control the loop bandwidth of the receiver PLL to reduce the activity of the phase pointer.

Another preferred embodiment includes a receiver PLL whose loop bandwidth is adjustable, a pixel error detector unit for detecting pixel errors, and control logic for measuring the pixel error rate to control the loop bandwidth of the receiver PLL to reduce the pixel error rate.

DETAILED DESCRIPTION OF THE INVENTION

Figure 1:
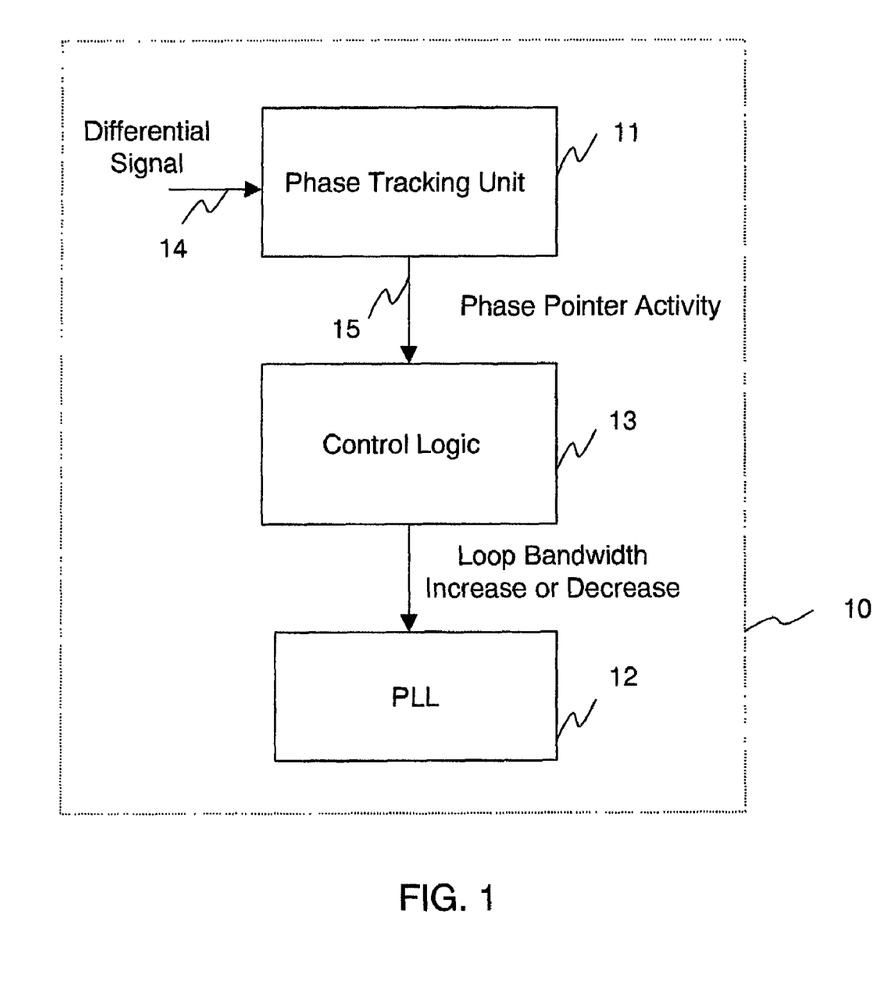
FIG. 1 is an overall block diagram of an embodiment of an adaptive system of the present invention based on the phase pointer activity.

FIG. 1 shows an overall block diagram depicting an exemplary adaptive control system to reduce jitter in accordance with the present invention. FIG. 1 shows a particular embodiment that may be used in a digital transmission system complying with a particular specification such as the Digital Visual Interface (DVI) specification, where the transmitter has a phase-locked loop (PLL) for sending out data to the receiver, and the receiver has a PLL for recovering data from the received clock and data.

The system 10 is comprised of a phase tracking unit 11 for measuring phase pointer activity, a receiver PLL 12 whose loop bandwidth is adjustable, and control logic 13, connected to the phase-tracking unit 11 and the receiver PLL 12, for generating a control signal to adjust the loop bandwidth of the receiver PLL 12 based on the phase pointer activity received from the phase-tracking unit 11. Phase pointers can be understood more fully in reference to U.S. Pat. No. 5,905,769.

The phase-tracking unit 11 receives a differential signal 14 from a transmitter (not shown) and oversamples the signal to generate a phase pointer by selecting the correct data sampling point out of the oversampled points. The phase pointer tracks the instantaneous phase shift of the received bit stream in order to select a set of correct sampling points.

The present invention uses the activity of the phase pointer to represent the relative jitter between the recovered data and clock. The relative jitter is reduced by measuring the phase pointer activity 15 and adjusting the loop bandwidth of the receiver PLL. The condition of minimum relative jitter occurs in a different context depending on the configuration of the transmitter used.

The transmitter may use an incoherent clock scheme where an internal clock signal is sent to the receiver without processing through a PLL, while data are sent to the receiver after sampling by a sub-clock derived from the internal clock signal through a PLL. In the receiver, a receiver PLL processes the received clock from the transmitter. Since the received clock has not been processed by the PLL in the transmitter side, the condition of minimum relative jitter (the condition where the phase of clock and data are correlated) occurs when the receiver PLL loop bandwidth is adjusted to be the same as the transmitter PLL loop bandwidth.

Alternatively, the transmitter may use a coherent clock scheme where the clock and data signals transmitted are made coherent because the internal clock signal is processed by a PLL. The processed clock signal is used not only as the clock signal sent to the receiver but is also used as a sampling clock for transmitting the data. Since the clock signal processed by the receiver PLL has already been processed by the transmitter PLL, the receiver PLL loop bandwidth must be substantially larger than the transmitter PLL loop bandwidth. The condition of minimum relative jitter occurs when the receiver PLL loop bandwidth is adjusted to be large compared to the transmitter PLL loop bandwidth.

The phase pointer activity may be measured in various ways. If the phase pointer's directional changes are represented as positive numbers such as +1 or +2 when the phase pointer shifts one direction, and as a negative number such as −1 or −2 when the phase pointer shifts the other direction, the absolute sum of the phase pointer's directional changes can be a measure of the phase pointer activity. The frequency of the phase pointer transitions, i.e., the number of phase shifts per unit time may be another measure. There may be many other ways of getting an equivalent value.

Figure 2:
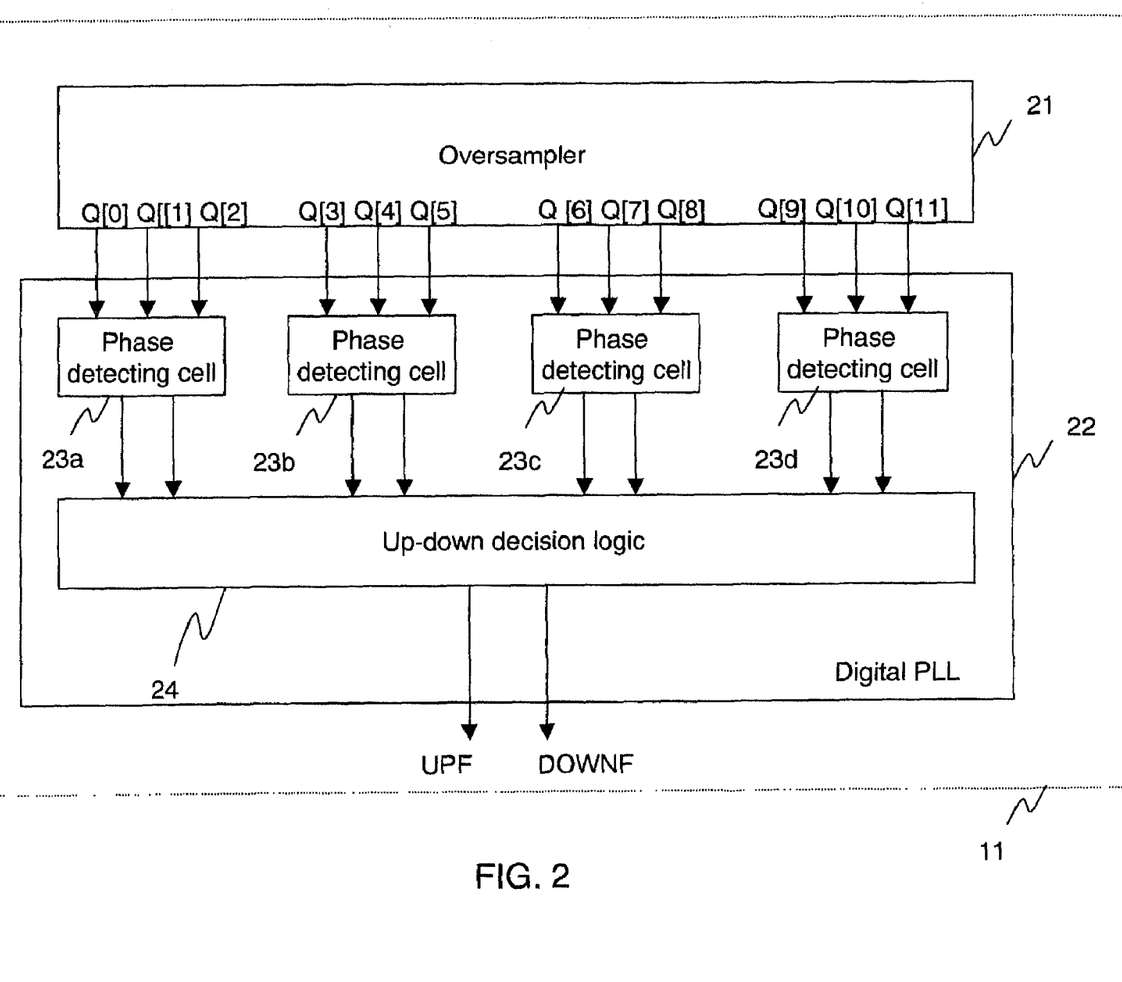
FIG. 2 is a block diagram of the phase tracking unit.

FIG. 2 shows a block diagram of a particular embodiment of a phase tracking unit 11. The particular embodiment includes an oversampler 21 for oversampling the receieved bit stream to generate oversampled points, for example, 3 samples per bit duration, and a digital PLL 22 for determining a phase pointer that indicates a correct sample point from the oversampled points. The digital PLL 22, which is different from the analog receiver PLL 12, is comprised of multiple phase detecting cells 23a, 23b, 23c and 23d, each of which receives 3 oversampled points for each symbol and determines an individual phase shift. Up-down decision logic 24 gathers the individual phase shift information from the phase detecting cells 23a, 23b, 23c and 23d, and generates the directional changes of the phase pointer in terms of UPF (upward phase transition) and DOWNF (downward phase transition), which serve to indicate the activity of the phase pointer. For more information on the implementation and operation of a digital PLL using oversampling, refer to U.S. Pat. No. 5,905,769.

Figure 3:
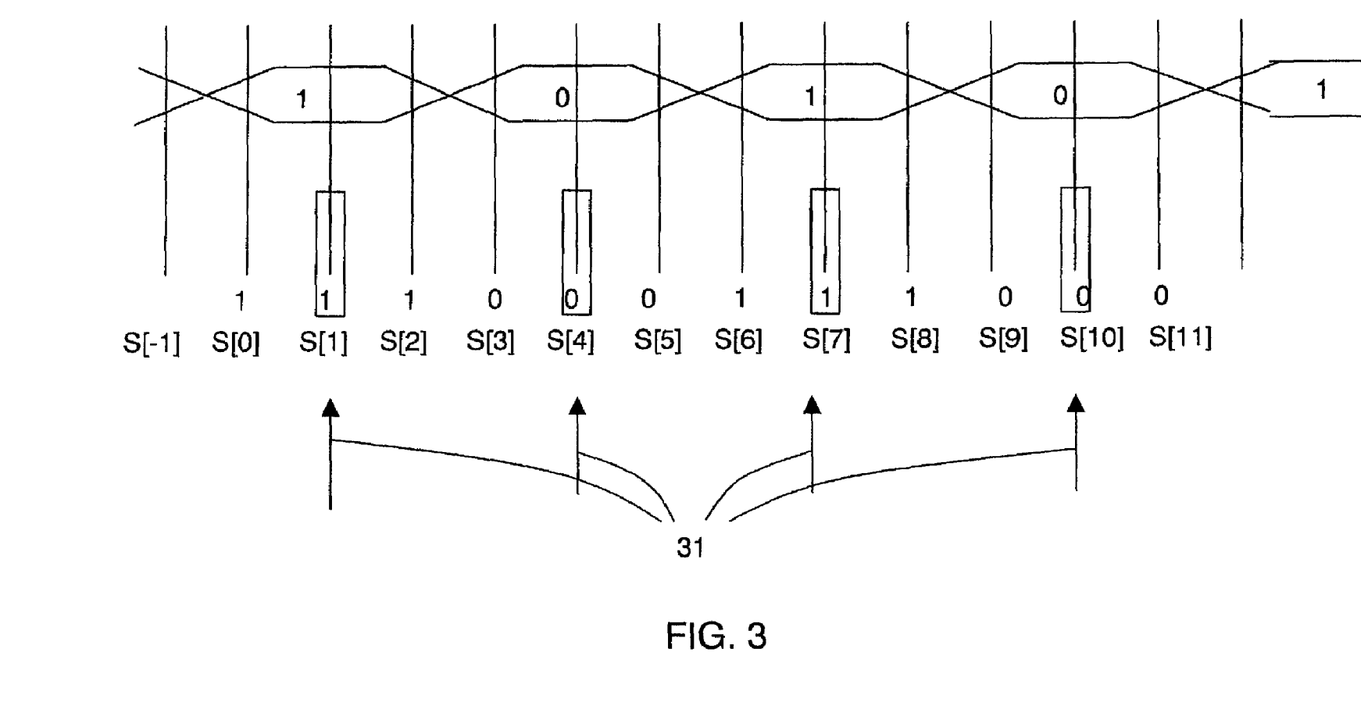
FIG. 3 is an illustration of a phase pointer where there is no skew.

FIG. 3 illustrates an example of a phase pointer for selecting one sample out of every three samples when there is no skew. For example, out of three samples, S[0], S[1] and S[2], a phase pointer 31 is located at S[1]. The phase pointer 31 is subsequently located at S[4], S[7] and S[10] for this 3× oversampled example. For more information on the phase pointer using oversampling, refer to U.S. Pat. No. 5,905,769.

Figure 4:
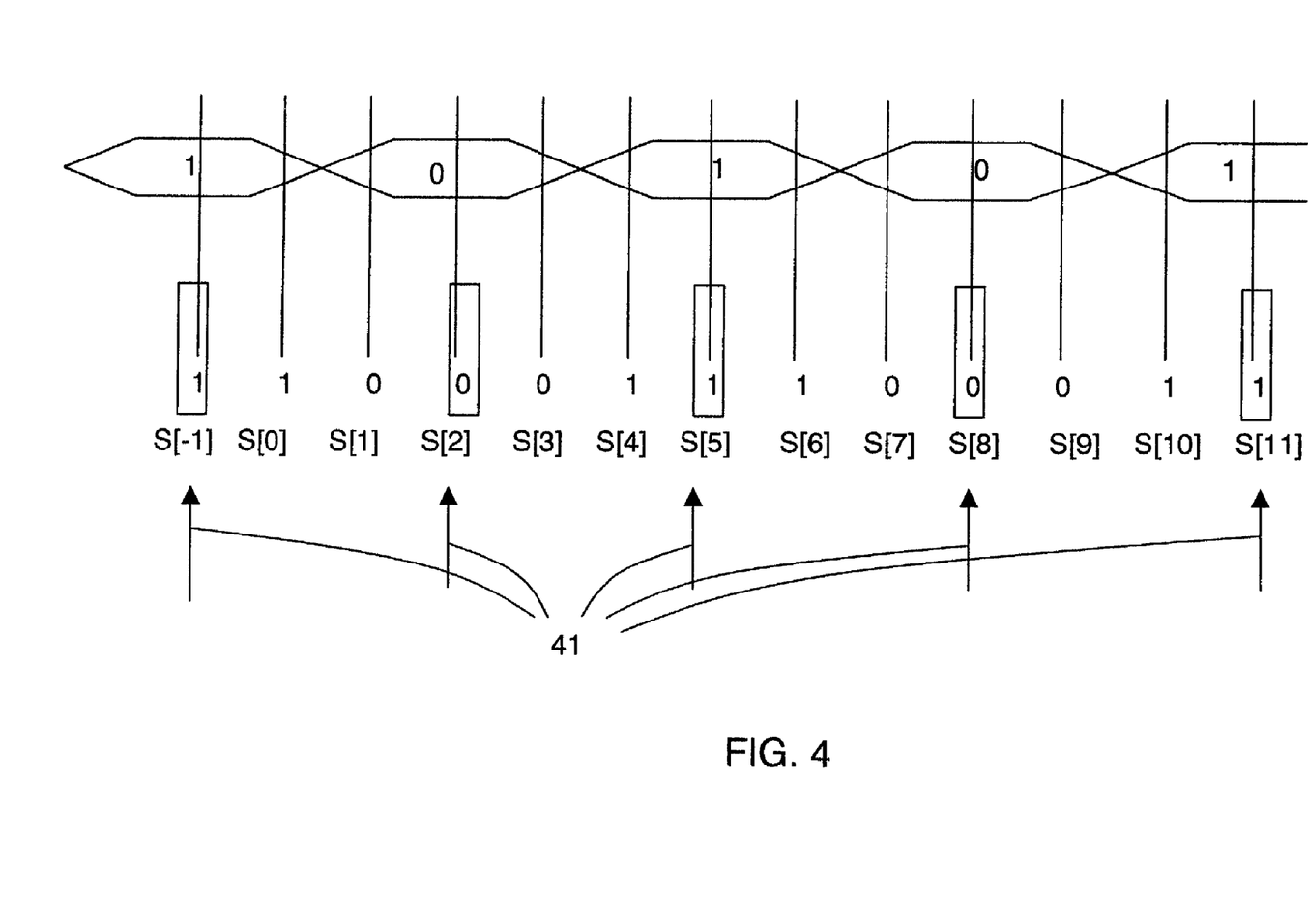
FIG. 4 is an illustration of a phase pointer when there is a skew.

FIG. 4 illustrates an example of a phase pointer where there is some skew between the received clock and data. Due to the skew, a phase pointer 41 shifts to a new point to select S[−1] because the phase pointer location at S[1] can no longer sample a correct value. The shifted phase pointer 41 is subsequently located at S[2], S[5] and S[8]. The phase pointer has been shifted upward because it has been shifted from the old position S[1] to a new position S[2]. For more information on the phase pointer using oversampling, refer to U.S. Pat. No. 5,905,769.

Figure 5:
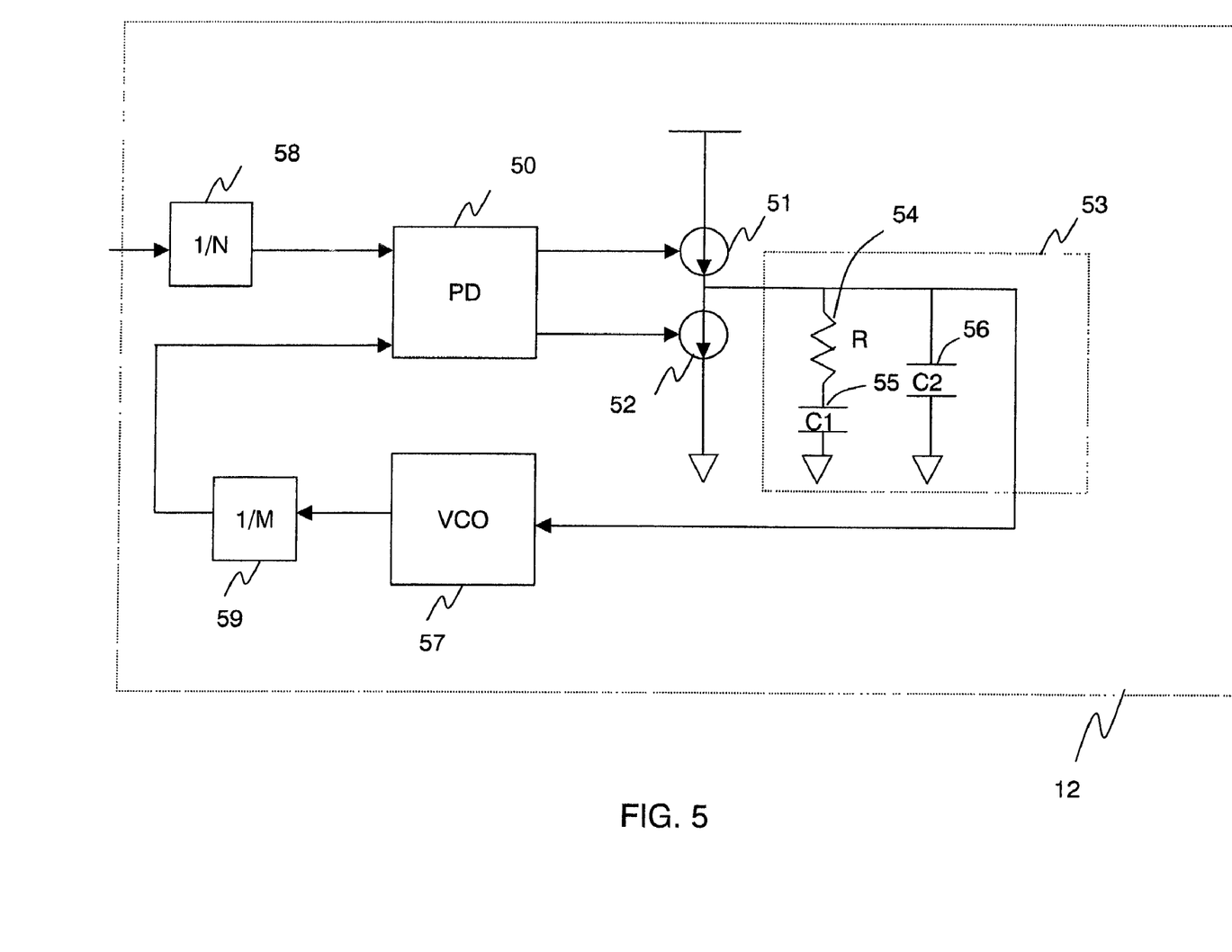
FIG. 5 is a schematic diagram of the receiver PLL whose loop bandwidth is adjustable.

FIG. 5 shows a schematic block diagram of a particular embodiment of a receiver PLL 12 whose loop bandwidth can be adjusted by changing a pumping current. The embodiment consists of a phase detector (PD) 50, current sources 51 and 52, a loop filter 53 consisting of a resistor R 54, capacitors C1 55 and C2 56, and a voltage-controlled oscillator (VCO) 57. The receiver PLL 12 may optionally include Divide-by-N 58 in the input and Divide-by-M 59 in the feedback. As the pumping current increases, the VCO 57 responds faster to frequency changes, increasing the loop bandwidth. It will be apparent to those skilled in the art that there are many other ways to control the loop bandwidth of a PLL, such as by adjusting a loop filter configuration, VCO gain, and other parameters.

Figure 6:
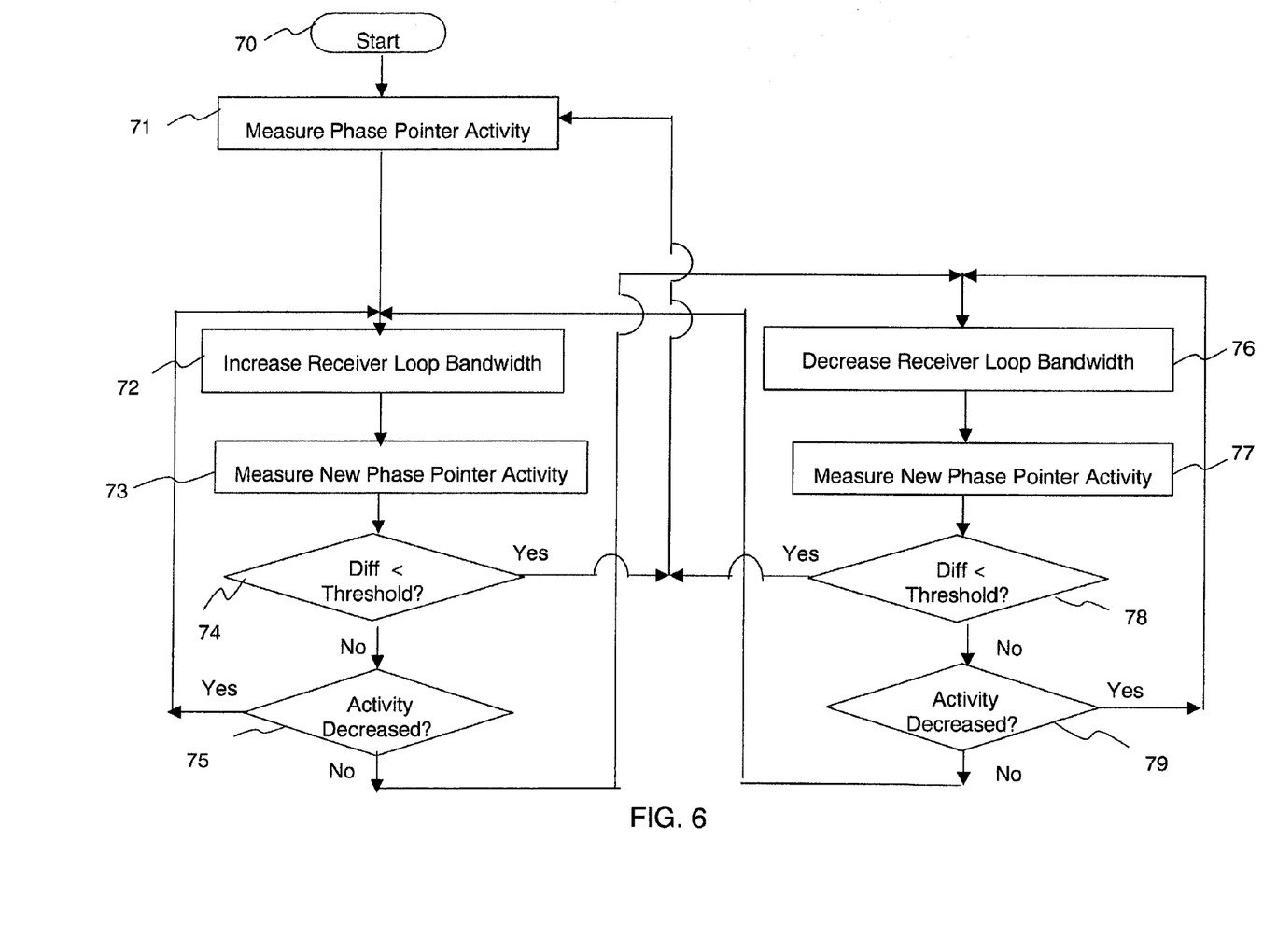
FIG. 6 is a flow chart of operations performed by the control logic.

FIG. 6 shows a flow chart of operations performed by the control logic 13. The system of the present invention tracks the loop bandwidth of the transmitter PLL by tuning the loop bandwidth of the receiver PLL to minimize the phase pointer activity. The tuning process is a trial and error process of iterating the steps of either incrementing or decrementing the loop bandwidth of the loop receiver PLL by comparing a new phase pointer activity in the current step with the old phase pointer activity in the previous step.

After a start in step 70, the phase pointer activity is measured in step 71. The measured activity value serves as a reference value. After the PLL loop bandwidth is increased by a step size in step 72, another activity value is measured in step 73 to determine the direction of PLL tuning, namely, whether to further increment or decrement the receiver PLL. The difference between the newly measured activity value and the old activity value is checked in step 74 as to whether it is below a threshold not. If it is below the threshold, the flow goes back to the step of 71 where the phase pointer activity is measured again without changing the PLL loop bandwidth. Otherwise, the newly measured activity is checked in step 75 as to whether the activity has been decreased with respect to the reference value. If so, the direction of estimation is in the right direction and it goes back to step 72 where the loop bandwidth is increased again by a step size.

If the activity has not been decreased, the direction of estimation was not the right direction. Therefore, the flow moves to step 76 where the loop bandwidth is decreased rather than increased by a fixed step. Then, a new activity is measured in step 79. The difference between the newly measured activity value and the old activity value is checked in step 78 as to whether it is below a threshold or not. If so, the flow goes back to the step of 71 where the phase activity is measured again without changing the PLL loop bandwidth. Otherwise, the newly measured activity is checked as to whether the activity has been decreased in step 79. If so, the direction of estimation was the right direction, and the flow moves to step 76 where the loop bandwidth is further decreased. If not, the direction of estimation was not the right direction, and the flow moves to step 72 where the loop bandwidth is increased rather than decreased.

The control logic 12, referring to FIG. 1, may be implemented in a finite state machine. A first activity value is used as the reference. If the activity value is lower than a certain threshold, which means that incoming clock of transmitter does not have excessive amount of jitter, the control feature may be safely disabled. However, as the clock frequency/ characteristics can always be changed, it is preferred to have the activity monitor operating all the time.

In a preferred embodiment, the phase pointer activity is measured when the data enable (DE) signal is low, that is during a video inactive/blanking period. Since there is little data transmission during that period, such measurement would greatly reduce data dependency of the phase pointer activity. In addition, accumulating the activity statistics for a sufficiently long period may further reduce the statistical uncertainty.

Data Collection Period

In one embodiment, the data representing the activities of the phase pointers in three independent channels may be accumulated within a predefined data collection period. The default period may be a frame time. However, if a V-Sync is not detected for a period longer than a usual V-Sync period, the receiver may assume that the system does not have a periodic V-Sync. In that case, the receiver can set the data collection period to another predefined number such as an H-Sync period.

Step Size

The above tuning process may be either an on-going process or made to stop when the activity value decreases below a threshold. The bandwidth step size may be varied with the activity value. Increasing the step size would achieve faster convergence to the desired loop bandwidth but at the risk of stability concerns. Simple heuristics may be used to further enhance the tuning process.

Scanning

In the case where the loop bandwidth of the receiver PLL is too far off from the optimum value, the incremental tuning process in the receiver PLL may not yield any noticeable change in the phase pointer activity. If this happens the tuning process is in a local minimum, but not a global minimum. This possibility is detected when the difference between the newly measured phase pointer activity and the old phase activity is less than a threshold, but the phase pointer activity value exceeds a predetermined limit. In this case, scanning the whole tunable range by changing the receiver loop bandwidth over the whole range and measuring the phase activity may be incorporated instead of incremental tuning to find out whether the local minimum condition is the global minimum. This scan may take place at the time of power-on or during a transient state such as when a video mode changes.

A transmitter PLL may be implemented in such a way that the loop bandwidth of the transmitter PLL can be changed depending on the video mode. In such a case, running a scan per each new video mode is desirable.

There are ways to detect the change of video mode quickly and accurately. The parameters to monitor may be the length of a data line, the length of an HSync blank period, the number of data lines between VSync blank periods, front/back porches of HSync and VSync pulses, and the logic polarities of HSync and VSync signals. The irregularities in the signal processing steps usually do not cause variation of more than 2 clocks. Any change in the period/length by more than 2 clock cycles may suggest that either the video mode is changed or the video mode is being changed. Any changes in the polarity of the HSync/VSync pulse may also suggest that the video mode is changed. As soon as the change is stabilized, a scanning procedure can take place.

Analysis of Phase Pointer's Directional Changes

The analysis of directional changes of the phase pointer may be useful in other applications, especially where the clock information is embedded in the data so that the clock information needs to be recovered from the data. In such a system, if there is an inherent frequency difference between the transmitter clock and the receiver clock, there will still be phase pointer activity even when both the transmitter and the receiver PLL bandwidths are tuned properly. Such phase pointer activity is manifested as a DC component of the phase pointer activity. In such a system, the DC component, the effect of frequency discrepancy, should be compensated for before any phase activity value is used control the receiver loop bandwidth. The average of the upward and downward changes of the phase pointer activities may be used as a measure of the frequency discrepancy.

Even in a system where there is no frequency difference between the transmitter PLL and the receiver PLL, the above analysis of directional changes of the phase pointer may be useful in detecting a lock-in behavior of the transmitter and receiver PLLs. If both PLLs are properly locked to each of individual incoming clocks, the net average of the upward and downward changes of the phase pointer activities should be asymptotically zero.

Adaptive Control Based on Data Error Rate

Figure 7:
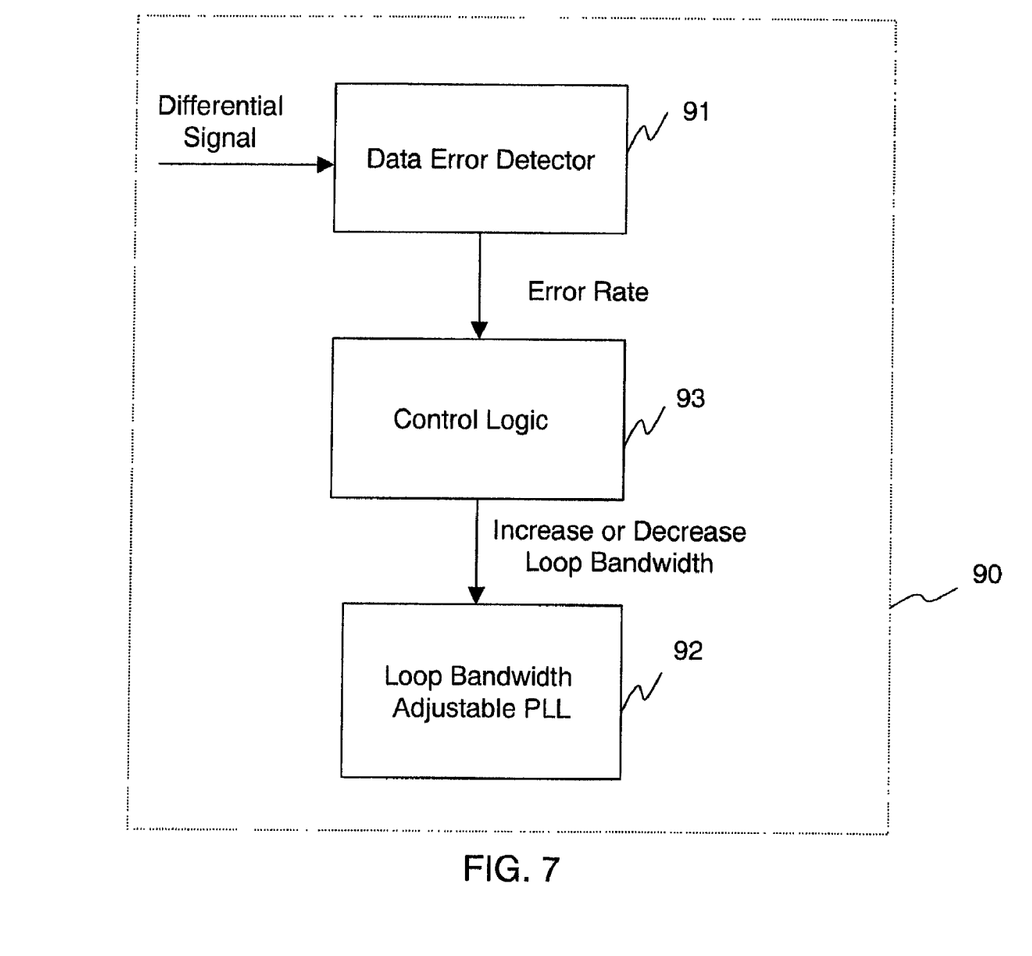
FIG. 7 is an overall block diagram of another embodiment of the present invention based on the pixel error rate.

FIG. 7 shows an adaptive control scheme based on a data error rate measured in digital video transmission. Instead of the phase pointer activity, a data error due to sub-optimal sampling points may be used as a parameter to adaptively control the loop bandwidth of the receiver PLL. The system 90 is comprised of a data error detector 91 for detecting data errors and measuring a data error rate, a receiver PLL 92 whose loop bandwidth is adjustable, and control logic 93, connected to the pixel error detector 91 and the receiver PLL 92, for generating a control signal to adjust the loop bandwidth of the receiver PLL 92 based on the pixel error rate received from the pixel error detector 91.

Pixel errors may be detected during phase tracking using oversampling. For example, in FIG. 3, S[1], S[4], S[7] and S[10] are optimal phase pointers, whereas S[0], S[2], S[3], S[5], S[6], S[8] and S[9] are sub-optimal phase pointers. If there has been a sub-optimal phase tracking due to sub-optimal loop bandwidth of the receiver PLL, the sub-optimal data values will show significant increase of errors.

If data encoding is used, an error may be detected by comparing the received encoded character with a table of permissible encoded characters. For example, in the case of TMDS coding, an 8-bit character is transformed to a 10-bit character. Out of the 1024 words in the 10-bit code space, only a subset is used as valid characters called in-band characters that correspond to the 8-bit characters, while the others are invalid characters called out-of-band (OOB) characters. Therefore, if the received character is one of the OOB characters, an error has occurred.

By counting these errors, a pixel error rate may be determined. Based on the pixel error rate, the best condition for the receiver PLL loop bandwidth may be determined using the previous iteration method to incrementally reduce the pixel error rate.

There are numerous benefits from using the adaptive bandwidth control scheme of the present invention. First, interoperability with a legacy transmitter or multi-vendor transmitters is greatly improved, because the receiver has the capability to adapt its PLL to the optimum value for a particular transmitter. Second, the transmitter PLL's variance with respect to supply/temperature/process variations may be tolerated because the receiver can adapt to the characteristics of the transmitter PLL. Third, the yield of a PLL to be used as a transmitter PLL may be improved against process variations, because the performance specification of the transmitter PLL may be relaxed. Fourth, the jitter is reduced regardless of whether the transmitter uses a coherent scheme or an incoherent scheme.

While the invention has been described with reference to preferred embodiments, it is not intended to be limited to those embodiments. It will be appreciated by those of ordinary skill in the art that many modifications can be made to the structure and form of the described embodiments without departing from the spirit and scope of this invention.

For example, although the preferred embodiment is shown using an oversampling receiver, it will be apparent to those skilled in the art that the present invention may be readily applied to other types of receivers, such as a tracking-type receiver that is designed to recover the clock signal from the data containing the clock information, rather than from a separate clock signal. If tracking is done in a digital domain, the implementation using a tracking-type receiver is similar to the one described above except that a digital tracking pointer is used instead of a phase pointer. If tracking is done in an analog domain in terms of tracking control voltage, an equivalent of the phase pointer activity may be obtained by integrating the magnitude of the AC component of the tracking control voltage.

What is claimed is:

1. A method of reducing jitter in data transmission between a transmitter and a receiver, where the receiver has a phase-locked loop (PLL) with a loop bandwidth for recovering a clock and data from the transmitter, the method comprising the steps of:
    measuring relative jitter between the recovered clock and the recovered data at the receiver; and
    measuring phase pointer activity where a phase pointer represents relative jitter between the recovered clock and the recovered data at the receiver, wherein said phase pointer activity is measured as an absolute sum phase pointer directional changes; and
    adaptively adjusting the PLL loop bandwidth of the receiver to reduce the relative jitter.

2. The method of claim 1, wherein said relative jitter is represented by the activity of a phase pointer indicating a correct data sampling point.

3. The method of claim 1, wherein the transmitter has a PLL for generating both the clock and the data.

4. The method of claim 1, wherein the transmitter has a PLL for generating the data.

5. A system for reducing jitter in data transmission between a transmitter and a receiver, where the receiver has a phase-locked loop (PLL) with a loop bandwidth for recovering a clock and data from the transmitter, the system comprising:
    means for measuring relative jitter between the recovered clock and the recovered data at the receiver;
    means for measuring phase pointer activity where a phase pointer represents relative jitter between the recovered clock and the recovered data at the receiver, wherein said phase pointer activity is measured as a frequency phase pointer changes; and
    means for adaptively adjusting the PLL loop bandwidth of the receiver to reduce the relative jitter.

6. The system of claim 5, wherein said relative jitter is represented by the activity of a phase pointer indicating a correct data sampling point.

7. The system of claim 5, wherein the transmitter has a PLL for generating both the clock and the data.

8. The system of claim 5, wherein the transmitter has a PLL for generating the data.

9. A method of reducing jitter in data transmission between a transmitter and a receiver, where the receiver has a phase-locked loop (PLL) with a loop bandwidth for recovering a clock and data from the transmitter, the method comprising the steps of:
   measuring phase pointer activity where a phase pointer represents relative jitter between the recovered clock and the recovered data at the receiver; wherein said phase pointer is determined from integration of a magnitude of an AC component of a control voltage representing received data phase changes; and
   adaptively adjusting a characteristic of the receiver so as to reduce the phase pointer activity.

10. The method of claim 9, wherein said characteristic of the receiver includes the receiver PLL loop bandwidth.

11. The method of claim 9, wherein said phase pointer is selected from oversampled points.

12. The method of claim 9, wherein said phase pointer is determined from a digital tracking pointer representing the phase changes of the received data.

13. The method of claim 9, wherein said phase pointer activity is measured as an absolute sum of phase pointer directional changes.

14. The method of claim 9, wherein said phase pointer activity is measured as a frequency of phase pointer changes.

15. The method of claim 9, wherein the transmitter uses a coherent clocking scheme where a transmitter PLL is used to generate the clock and the data.

16. The method of claim 9, wherein the transmitter uses an incoherent clocking scheme where a transmitter PLL is used to generate the data only.

17. The method of claim 9, wherein a transmitter PLL loop bandwidth changes depending on a video mode.

18. A system for reducing jitter in data transmission between a transmitter and a receiver, where the receiver has a phase-locked loop (PLL) with a loop bandwidth for recovering a clock and data from the transmitter, the system comprising:
   means for measuring phase pointer activity where a phase pointer represents relative jitter between the recovered clock and the recovered data at the receiver, wherein said phase pointer is determined from integration of a magnitude of an AC component of a control voltage representing received data phase changes; and
   means for adaptively adjusting a characteristic of the receiver so as to reduce the phase pointer activity.

19. The system of claim 18, wherein said characteristic of the receiver includes the receiver PLL loop bandwidth.

20. The system of claim 18, wherein said phase pointer is selected from oversampled points.

21. The system of claim 18, wherein said phase pointer is determined from a digital tracking pointer representing received data phase changes.

22. The system of claim 18, wherein said phase pointer activity is measured as an absolute sum of phase pointer directional changes.

23. The system of claim 18, wherein said phase pointer activity is measured as a frequency of phase pointer changes.

24. The system of claim 18, wherein the transmitter uses a coherent clocking scheme where a transmitter PLL is used to generate the data and the clock.

25. The system of claim 18, wherein the transmitter uses an incoherent clocking scheme where a transmitter PLL is used to generate the data.

26. The system of claim 18, wherein a transmitter PLL loop bandwidth changes depending on a video mode.

27. A method for receiving data by a receiver from a transmitter with reduced jitter where the receiver has a PLL for recovering data and a clock from the transmitter, the method comprising the steps of:
   tracking a phase pointer representing a relative jitter between the recovered data and clock, wherein the data is encoded using Transition Minimized Differential Signaling (TMDS);
   measuring phase pointer activity; and
   adjusting the loop bandwidth of the receiver PLL based on the phase pointer activity measured.

28. The method of claim 27, wherein the step of tracking further includes the step of oversampling to produce oversampled points from which a phase pointer is selected.

29. The method of claim 27, wherein the phase pointer activity is measured in terms of the absolute sum of phase pointer directional changes.

30. The method of claim 27, wherein the phase pointer activity is measured in terms of the frequency of the phase pointer changes.

31. A system receiving data from a transmitter with reduced jitter where a receiver has a phase locked-loop (PLL) for recovering data and clock from the transmitter, the system comprising:
   a phase-tracking unit for tracking a phase pointer representing a relative jitter between the recovered data and clock;
   control logic for measuring the activity of the phase pointer to produce a control signal; and
   a PLL for recovering the clock, wherein a loop bandwidth of the PLL can be adjusted based on the control signal from the control logic.

32. The system of claim 31, wherein the phase tracking unit further includes an oversampling circuit for oversampling the received data to produce oversampled points from which the phase pointer is selected.

33. The system of claim 31, wherein the phase pointer activity is measured in terms of an absolute sum of phase pointer directional changes.

34. The system of claim 31, wherein the phase pointer activity is measured in terms of a frequency of phase pointer changes.

35. The system of claim 31, wherein data is encoded using Transition Minimized Differential Signaling (TMDS).

36. A method of adaptively controlling a loop bandwidth of a receiver PLL to minimize relative phase between a recovered data and clock where the receiver and a transmitter operate at substantially the same clock frequency, comprising the steps of:
   measuring phase pointer activity;
   incrementally changing the receiver PLL loop bandwidth;
   measuring new phase pointer activity; and
   calculating a difference between the new phase pointer activity and the phase pointer activity.

37. The method of claim 36, further comprising the step of determining a local minimum if the difference is below a threshold.

38. The method of claim 37, further comprising the step of performing a scan by changing the receiver PLL loop bandwidth over a tunable range and measuring phase pointer activity if the difference is equal or above a predetermined limit.

39. A method of adaptively controlling a loop bandwidth of a receiver PLL to minimize a relative phase between a recovered data and clock where the receiver and a transmitter operate at different clock frequencies, comprising the steps of:

measuring a phase pointer activity in DC and AC components; and adjusting the phase pointer activity by compensating for the DC component of the phase pointer activity.

40. The method of claim 39, further comprising the steps of:

incrementally changing the receiver PLL loop bandwidth;

measuring new adjusted phase pointer activity; and calculating a difference between the adjusted the new phase pointer activity and the phase pointer activity.

41. The method of claim 40, further comprising the step of determining a local minimum if the difference is below a threshold.

42. The method of claim 41, further comprising the step of performing a scan by changing the receiver PLL loop bandwidth over a tunable range and measuring phase pointer activity if the difference is equal or above a predetermined limit.

43. A method of reducing jitter in data transmission between a transmitter and a receiver, where encoding is used for the data transmission, and the receiver has a phase-locked loop (PLL) with a loop bandwidth for recovering a clock and data from the transmitter, the method comprising the steps of:

measuring an error rate at the receiver;

adaptively adjusting the PLL loop bandwidth of the receiver to reduce the error rate;

comparing a received encoded character with a set predefined out-of-band (OOB) characters; and detecting an error if the encoded character is the same as any OOB character.

44. The method of claim 43, wherein the data encoding uses TMDS coding.

45. A method of adaptively controlling the loop bandwidth of a receiver PLL to minimize a relative phase between a recovered data and clock where the receiver and a transmitter operate at substantially a same clock frequency, comprising the steps of:

measuring phase pointer activity; and measuring a DC component of the phase pointer activity and repeating the step of measuring the phase pointer activity if the magnitude of the DC component is above a predetermined limit.

\* \* \* \* \*